(12) United States Patent
Akutsu

(10) Patent No.: US 7,975,249 B2
(45) Date of Patent: Jul. 5, 2011

(54) OPERATION TIMING VERIFYING APPARATUS AND PROGRAM

(75) Inventor: Shigekiyo Akutsu, Hachiouji (JP)

(73) Assignee: Oki Semiconductor Co., Ltd. (JP)

( * ) Notice: Subject to any disclaimer, the term of this patent is extended or adjusted under 35 U.S.C. 154(b) by 320 days.

(21) Appl. No.: 12/261,123

(22) Filed: Oct. 30, 2008

(65) Prior Publication Data

US 2009/0276744 A1  Nov. 5, 2009

(30) Foreign Application Priority Data

Nov. 12, 2007  (JP) ................................. 2007-292932

(51) Int. Cl.
*G06F 17/50* (2006.01)
(52) U.S. Cl. ............................ 716/113; 716/119; 703/16
(58) Field of Classification Search .................. 716/6, 9, 716/10, 113, 119; 703/16
See application file for complete search history.

(56) References Cited

U.S. PATENT DOCUMENTS

| | | | | |
|---|---|---|---|---|
| 6,272,668 B1 * | 8/2001 | Teene | ............................... | 716/10 |
| 7,191,418 B2 * | 3/2007 | Lee et al. | ........................... | 716/6 |
| 7,219,048 B1 * | 5/2007 | Xu | ................................... | 703/19 |
| 7,594,204 B1 * | 9/2009 | Singh et al. | ....................... | 716/3 |
| 2006/0010414 A1 * | 1/2006 | Lee et al. | ......................... | 716/10 |

FOREIGN PATENT DOCUMENTS

| | | |
|---|---|---|
| JP | 10-240796 | 9/1998 |
| JP | 2005-141434 | 6/2005 |

OTHER PUBLICATIONS

Bozorgzadeh et al., "Optimal Integer Delay-Budget Assignment on Directed Acyclic Graphs", IEEE Transactions on Computer-Aided Design of Integrated Circuits and Systems, vol. 23, No. 7, Jul. 2004, pp. 1184-1199.*

* cited by examiner

*Primary Examiner* — Phallaka Kik
(74) *Attorney, Agent, or Firm* — Studebaker & Brackett PC; Donald R. Studebaker

(57) ABSTRACT

An operation timing verifying apparatus and program for accurately verifying operation timings of a semiconductor integrated circuit in design with suppressing design time and cost. The operation timing verifying apparatus and program sets an unreal corner condition that all delay elements present a maximum delay as an operating condition, performs operation timing analysis in the operating condition, thereby extracting an operation-violating circuit path, if any, from a circuit layout, sets a real corner condition that at least one element type of delay elements from among the delay elements present a maximum delay as the operating condition and performs the operation timing analysis on only the operation-violating circuit path to determine again whether an operation violation exists therein.

9 Claims, 10 Drawing Sheets

ENTIRE TIMING ANALYSIS CORNER TABLE

| CORNER CONDITION | Cj | Rj | Tj | CELL DELAY TIME |
|---|---|---|---|---|
| CRmaxTmax | Max | Max | Max | Max |
| CRminTmin | Min | Min | Min | Min |

SECTIONAL TIMING ANALYSIS CORNER TABLE

| CORNER CONDITION | Cj | Rj | Tj | CELL DELAY TIME |
|---|---|---|---|---|
| CmaxRminTmax | Max | Min | Max | Max |
| CminRmaxTmax | Min | Max | Max | Max |
| CmaxRminTmin | Max | Min | Min | Min |
| CminRmaxTmin | Min | Max | Min | Min |

OPERATION TIMING ANALYSIS PROCEDURE

```
*NET net1
R1 net1:0 net1:1 10
R2 net1:1 net1:2 30
R3 net1:2 net1:3 10
R4 net1:3 net1:4 10
C1 net1:1 0 0.1f
C2 net1:2 0 0.2f
C3 net1:3 0 0.3f
```

EXAMPLE OF LINE R/C NET LIST

FIG. 10

| CELL DELAY TIME [ps] | | INPUT VOLTAGE TRANSITION TIME | | | |
|---|---|---|---|---|---|
| | | 50ps | 100ps | 200ps | 500ps |
| | 5fF | 100 | 150 | 170 | 200 |
| | 50fF | 1000 | 1500 | 1700 | 2000 |
| | 100fF | 2000 | 3000 | 3400 | 4000 |
| | 500fF | 5000 | 7500 | 8500 | 10000 |

LOAD CAPACITANCE

EXAMPLE OF LOGIC CELL DELAY LIBRARY

US 7,975,249 B2

OPERATION TIMING VERIFYING APPARATUS AND PROGRAM

BACKGROUND OF THE INVENTION

1. Field of the Invention

The present invention relates to an operation timing verifying apparatus and program for verifying operation timings of a semiconductor integrated circuit in design.

2. Description of the Related Art

In the manufacture of semiconductor integrated circuits, elements such as transistors and connection lines are becoming increasingly fine. As elements become finer, the delay time of transistors decreases, but as to connection lines, line-to-line capacitances increase due to the shrinkage of line intervals, and in addition line resistances increase due to reduction in line cross-section area, and hence the delay time of connection lines tends to increase.

Meanwhile, in the design of a semiconductor integrated circuit, its operation timings need to be verified taking into account production variations of elements such as transistors and of lines. Factors in element variation include variations in processed sizes, in temperature, and in power supply voltage, and factors in line variation include variations in line widths, film thickness, in interlayer film thickness, in insulator permittivity, and in temperature.

In a conventional operation timing verifying method, operation timings of a circuit are verified in the respective conditions that the delay times of the entire circuit are minimal and maximal, each of the conditions being a combined condition of the line R/C net list derived condition that line capacitances and line resistances are minimal or maximal and the logic cell delay library derived condition that the delay times of logic cells such as arithmetic circuits are minimal or maximal. Here, the condition that the delay times of the entire circuit are minimal is referred to as the best corner, and the condition that the delay times of the entire circuit are maximal is referred to as the worst corner.

In Japanese Patent Application Kokai No. H10-240796 (Reference 1), there is disclosed a circuit simulation technique for variation analysis where variations in electrical characteristic values are reflected which are process data corresponding to line capacitances, line resistances, and the like. In Japanese Patent Kokai No. 2005-141434 (Reference 2), there is disclosed a timing verifying technique for highly accurate timing verification taking into account all combinations of various corner conditions and in which particular corner conditions corresponding to a design restriction for paths are selected from multiple actually possible corner conditions, thereby avoiding waste.

SUMMARY OF THE INVENTION

However, there is the problem with the above conventional art that as circuit layouts become more complicated and circuit scales increase with advances in LSI high integration, the analysis tool becomes more complicated and design time and cost spent in verifying operation timings increase.

An object of the present invention is to provide an operation timing verifying apparatus and program capable of accurate operation timing verification with suppressing design time and cost in designing semiconductor integrated circuits.

According to the present invention, there is provided an operation timing verifying apparatus which reads in circuit data representing a circuit layout including a plurality of delay elements and performs operation timing analysis in a settable operating condition on the circuit layout. The apparatus comprises an operation-violating circuit path extracting unit that sets an unreal corner condition that all of the delay elements present a maximum delay as the operating condition and performs the operation timing analysis, thereby extracting an operation-violating circuit path, if any, from the circuit layout; and an operation violation determining unit that, if the operation-violating circuit path is extracted, sets a real corner condition that at least one element type of delay elements from among the delay elements present a maximum delay as the operating condition and performs the operation timing analysis on only the operation-violating circuit path to determine again whether an operation violation exists therein.

According to the present invention, there is provided an operation timing verifying program for making a computer to function as means to read in circuit data representing a circuit layout including a plurality of delay elements and to perform operation timing analysis in a settable operating condition on the circuit layout. The verifying program comprises an operation-violating circuit path extracting process that sets an unreal corner condition that all of the delay elements present a maximum delay as the operating condition and performs the operation timing analysis, thereby extracting an operation-violating circuit path, if any, from the circuit layout; and an operation violation determining process that, if the operation-violating circuit path is extracted, sets a real corner condition that at least one element type of delay elements from among the delay elements present a maximum delay as the operating condition and performs the operation timing analysis on only the operation-violating circuit path to determine again whether an operation violation exists therein.

With the operation timing verifying apparatus and program according to the present invention, accurate operation timing verification is possible in the design of a semiconductor integrated circuit with suppressing design time and cost.

BRIEF DESCRIPTION OF THE DRAWINGS

FIG. 5 shows an example of the setting of an entire timing analysis corner table;

FIG. 6 shows an example of the setting of a sectional timing analysis corner table;

FIG. 10 shows an actual example of a logic cell delay library.

DETAILED DESCRIPTION OF THE INVENTION

An embodiment of the present invention will be described in detail below with reference to the accompanying drawings.

<Basic Principle of the Invention>

Figure 1:
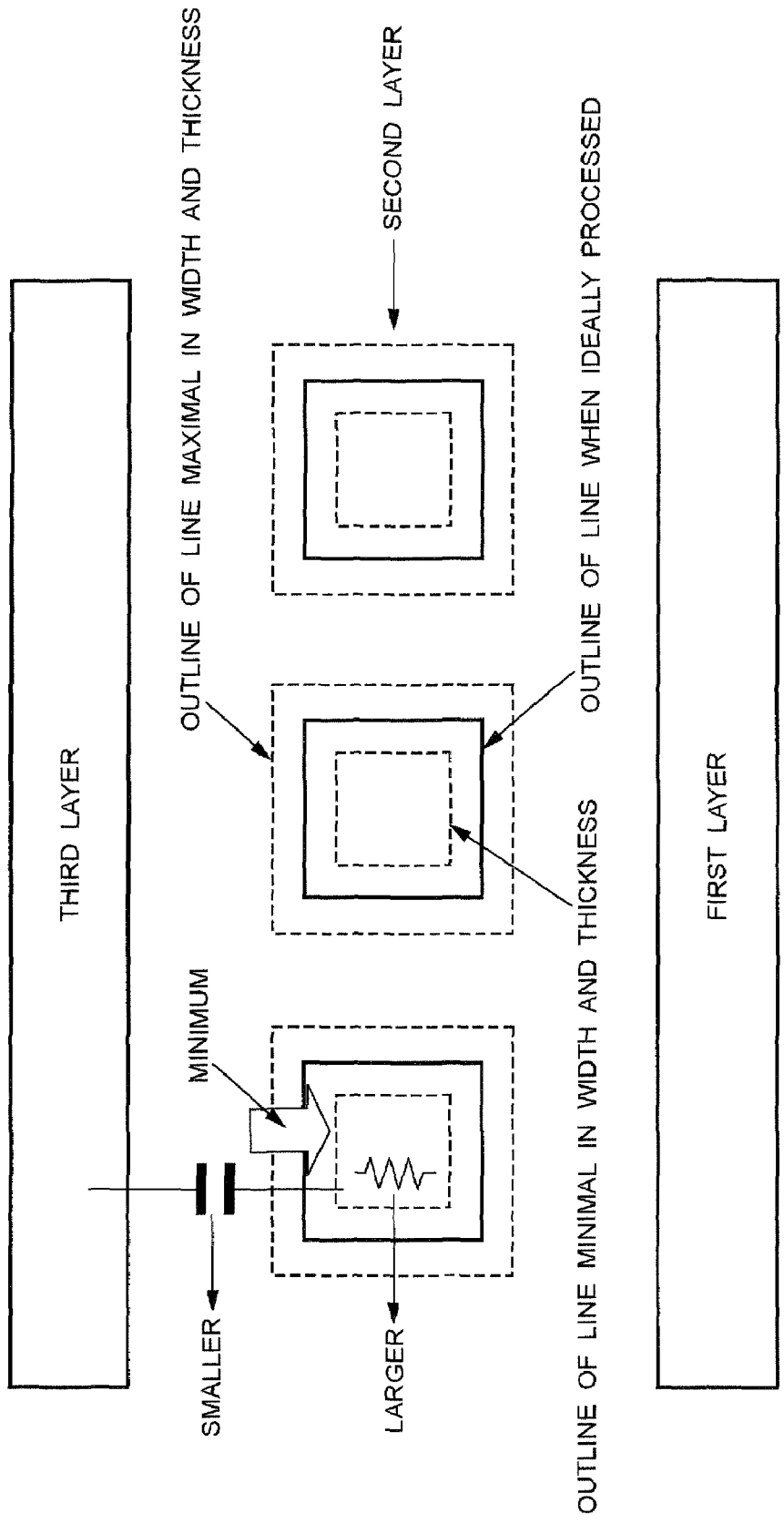
FIG. 1 illustrates a physical relationship between line capacitances and line resistances in a multi-layer structured semiconductor integrated circuit.

FIG. 1 illustrates a physical relationship between line capacitances and line resistances in a multi-layer structured semiconductor integrated circuit. The physical relationship is as follows. The condition for line capacitances becoming larger is that the distances of lines above, below, to the left, and to the right with respect to a line of a center second layer become smaller, namely, that the width and thickness of lines of the second layer become larger. However, under the condition that the width and thickness of lines of the second layer become larger, the line resistances of the second layer lines become smaller because their cross-section areas become larger. In contrast, the condition for line resistances becoming larger is that the width and thickness of the lines become smaller. However, under that condition, their line capacitances become smaller.

Note that in FIG. 1 the solid lines of the second layer indicate the outlines of the connection lines when ideally processed, that the broken lines inside the solid lines indicate the outlines of the connection lines which are minimal in width and thickness, and that the broken lines outside the solid lines indicate the outlines of the connection lines which are maximal in width and thickness.

Therefore, it is impractical, with ignoring the above-described physical relationship, to perform timing analysis in two corner conditions: the worst corner where line capacitances are maximal and line resistances are maximal and the best corner where line capacitances are minimal and line resistances are minimal.

Figure 2:
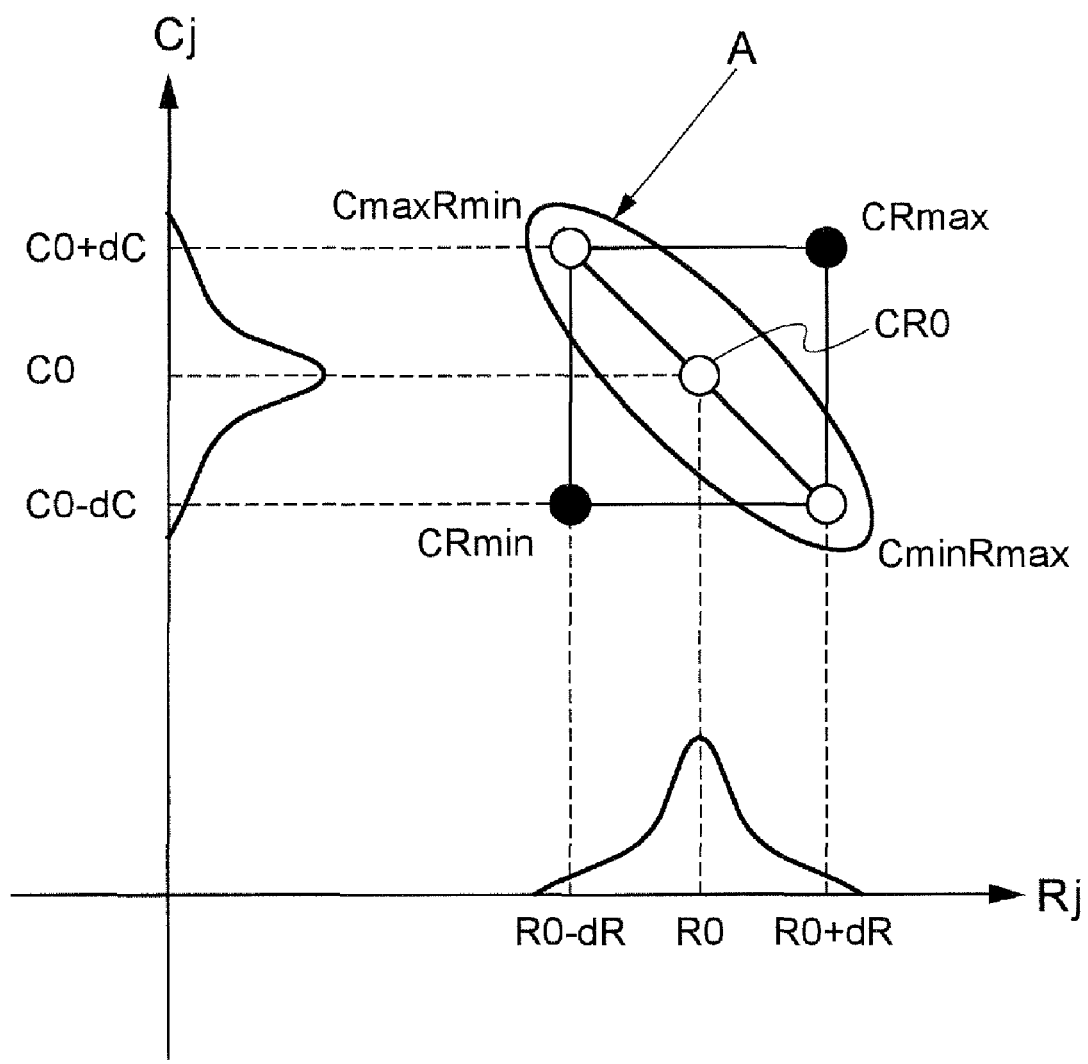
FIG. 2 illustrates variation in the combination of a line capacitance Cj and a line resistance Rj.

FIG. 2 shows variation in the combination of a line capacitance Cj and a line resistance Rj. Here, let C0 be a standard line capacitance and R0 be a standard line resistance of a line made to have standard finished sizes. In addition it is assumed that variation in the line capacitance and variation in the line resistance take on Gauss distributions with a capacitance variation range dC and a resistance variation range dR respectively.

As shown in the figure, if the physical relationship is ignored, the range of the combination of a line capacitance and a line resistance is denoted as a rectangle whose vertexes are at four coordinate points, called line R/C corners, namely, the bottom left coordinate point CRmin, the top left coordinate point CmaxRmin, the top right coordinate point CRmax, and the bottom right coordinate point CminRmax.

However, the real range when considering actual line shapes which are physically possible is a range indicated by the area A. That is, the coordinate point CRmax is an unreal worst corner, and the coordinate point CRmin is an unreal best corner. Meanwhile, the coordinate points CmaxRmin and CminRmax are real corners.

Considering delays in circuit paths in these real corners, it is expected that delay times in the real corners will be always greater than delay times in the unreal best corner and smaller than delay times in the unreal worst corner. Thus, it is expected that in a circuit path where a timing violation does not occur in the unreal best corner and worst corner, a timing violation does not occur when performing timing verification in real corners, either. Hence, such a circuit path can be excluded from analysis subjects.

Figure 3:
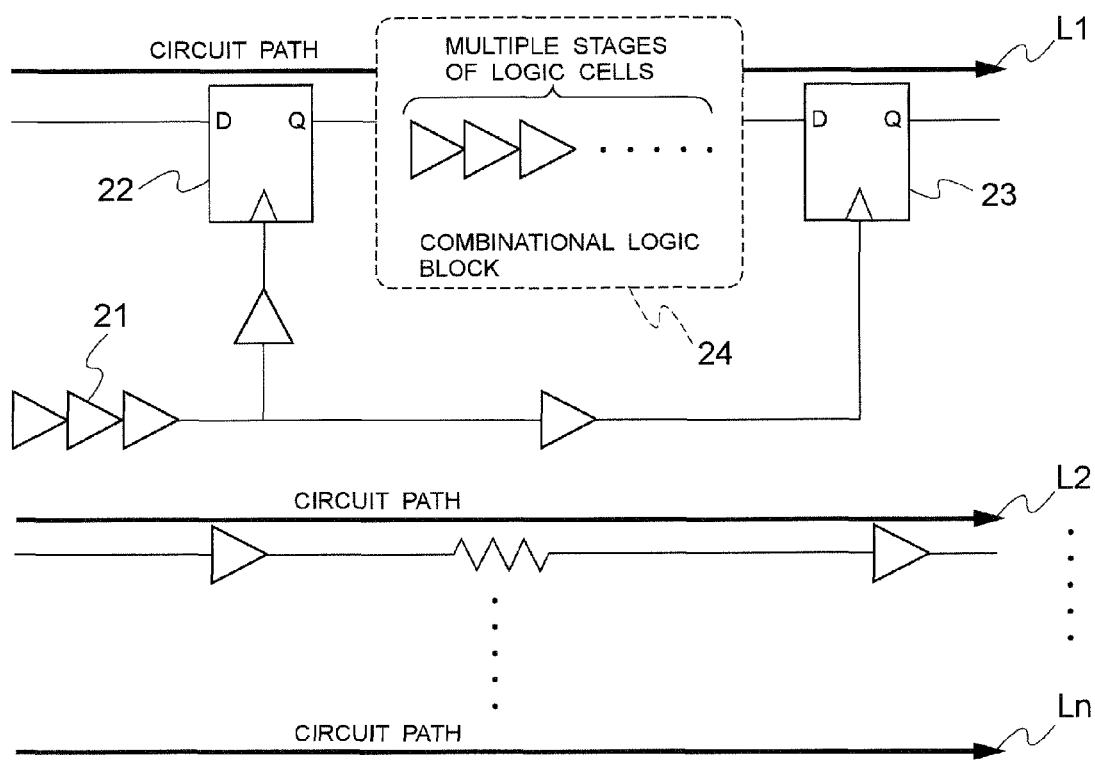
FIG. 3 illustrates operation timings in critical circuit paths.

FIG. 3 illustrates operation timings in critical circuit paths. The circuit of FIG. 3 includes multiple circuit paths L1 to Ln, where n is a positive integer, which can be a delay path in a semiconductor integrated circuit. Each of the circuit paths L1 to Ln is extracted by, e.g., a circuit analysis tool performing STA (Static Timing Analysis).

Referring to the circuit path L1, a first flip flop 22 inputs its output data to a combinational logic block 24. The combinational logic block 24 is assumed to be a logic block that comprises multiple stages of logic cells or a long connection line, thus being relatively large in delay time. The combinational logic block 24 inputs its output data to a second flip flop 23. The first and second flip flops 22, 23 sample and hold a data signal synchronously with a sync signal given from a clock buffer 21.

In order that the circuit path L1 operates normally, the combinational logic block 24 needs to finish processing data received from the first flip flop 22 so that data at the input of the second flip flop 23 is definite in one period of the sync signal. Hence, operation timing verification needs to be performed as to whether the delay of the combinational logic block 24 is within one period. This is because if the number of stages of logic cells is large or a long connection line exists in the combinational logic block 24, there is a possibility that data may not become definite in one period, so that the second flip flop 23 holds a wrong signal.

As such, circuit paths requiring operation timing verification like the circuit path L1, namely, critical circuit paths are extracted through the operation timing analysis in combined conditions of unreal worst corner and best corner conditions of the above-mentioned line R/C corners and maximum and minimum delay times of logic cells, and for only the extracted circuit paths, operation timing verification is performed again in combined conditions of the real line R/C corner conditions and maximum and minimum delay times of logic cells. By this means, computation time and cost can be suppressed.

<Operation Timing Verifying Program of the Invention>

Figure 4:
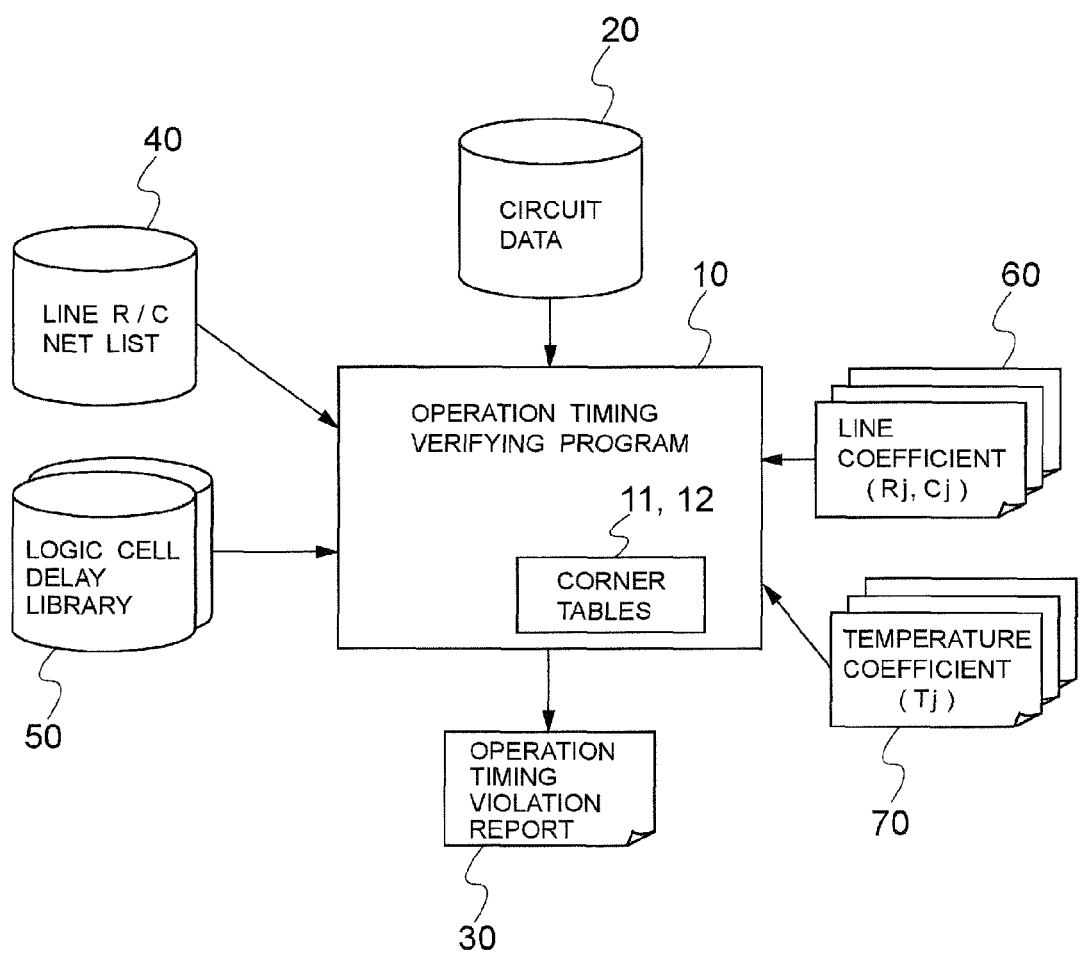
FIG. 4 is a block diagram showing an embodiment of the present invention and the execution environment for an operation timing verifying program of the invention.

FIG. 4 shows an embodiment of the invention and the execution environment for an operation timing verifying program of the invention. An operation timing verifying program 10 reads in circuit data 20 representing the circuit layout of a semiconductor integrated circuit and performs operation timing verification to output an operation timing violation report 30. When executing the operation timing verification, the operation timing verifying program 10, referring to a logic cell delay library 50, a line coefficient (Rj, Cj) list 60, and a temperature coefficient (Tj) list 70, generates a line R/C net list 40.

The operation timing verifying program 10 can be executed by a computer such as a work station and may be embodied as an operation timing verifying apparatus having a computer therein. Needless to say, the operation timing verifying program 10 may be stored in memory or a storage device of the computer, or supplied, in the form of a signal, to the computer from a server outside the computer.

Figure 9:
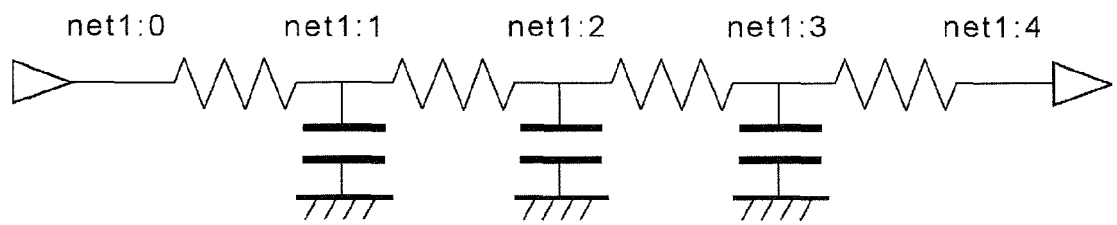
FIG. 9 shows an actual example of a line R/C net list.

The line R/C net list 40 is a file in which the calculated values of line capacitances and line resistances of the connection lines between all logic cells in a semiconductor integrated circuit (LSI) are recorded. The line capacitances and line resistances are calculated based on standard structure values that are free of line processing variation. An example of the line R/C net list 40 is shown in FIG. 9.

The logic cell delay library 50 is a file in which delay time information of each logic cell performing a logical operation is recorded. The delay time of each logic cell is presented for each of various operating conditions such as load capacitance (see FIG. 10).

The line coefficient (Rj, Cj) list 60 is a file in which the coefficients of line resistances and line capacitances calculated based on standard structure values that are free of line processing variation are presented for each operating condition. The temperature coefficient (Tj) list 70 is a file in which the temperature coefficient denoting the temperature dependency of line resistances calculated based on the standard structure values free of variation is presented for each operating condition.

The operation timing verifying program 10 executes operation timing analysis in a settable operating condition on the circuit layout represented by the circuit data 20. Such operating conditions are set in an entire timing analysis corner table 11 and a sectional timing analysis corner table 12, where a value is designated for each delay element type (line resistance, line capacitance, temperature, and logic cell) included in the circuit layout.

FIG. 5 shows an example of the setting of the entire timing analysis corner table 11. The entire timing analysis corner table 11 has an unreal worst corner condition (CRmaxTmax) and an unreal best corner condition (CRminTmin) set therein. The unreal worst corner condition (CRmaxTmax) is the combination of the maximum of capacitance coefficient (Cj), the maximum of resistance coefficient (Rj), the maximum of temperature coefficient (Tj), and the maximum of logic cell delay time. The unreal best corner condition (CRminTmin) is the combination of the minimum of capacitance coefficient (Cj), the minimum of resistance coefficient (Rj), the minimum of temperature coefficient (Tj), and the minimum of logic cell delay time.

FIG. 6 shows an example of the setting of the sectional timing analysis corner table 12. The sectional timing analysis corner table 12 includes four corner conditions: CmaxRminTmax, CminRmaxTmax, CmaxRminTmin, and CminRmaxTmin. Here, because there is a physical correlation between the temperature coefficient (Tj) and the cell delay time, the combination of the maximum of temperature coefficient (Tj) and the maximum of the cell delay time and the combination of the minimum of temperature coefficient (Tj) and the minimum of the cell delay time are taken and each combined with each of the two combinations of the maximum and minimum of capacitance coefficient (Cj) and the minimum and maximum of resistance coefficient (Rj) to form only four corner conditions in the sectional timing analysis corner table 12.

Figure 7:
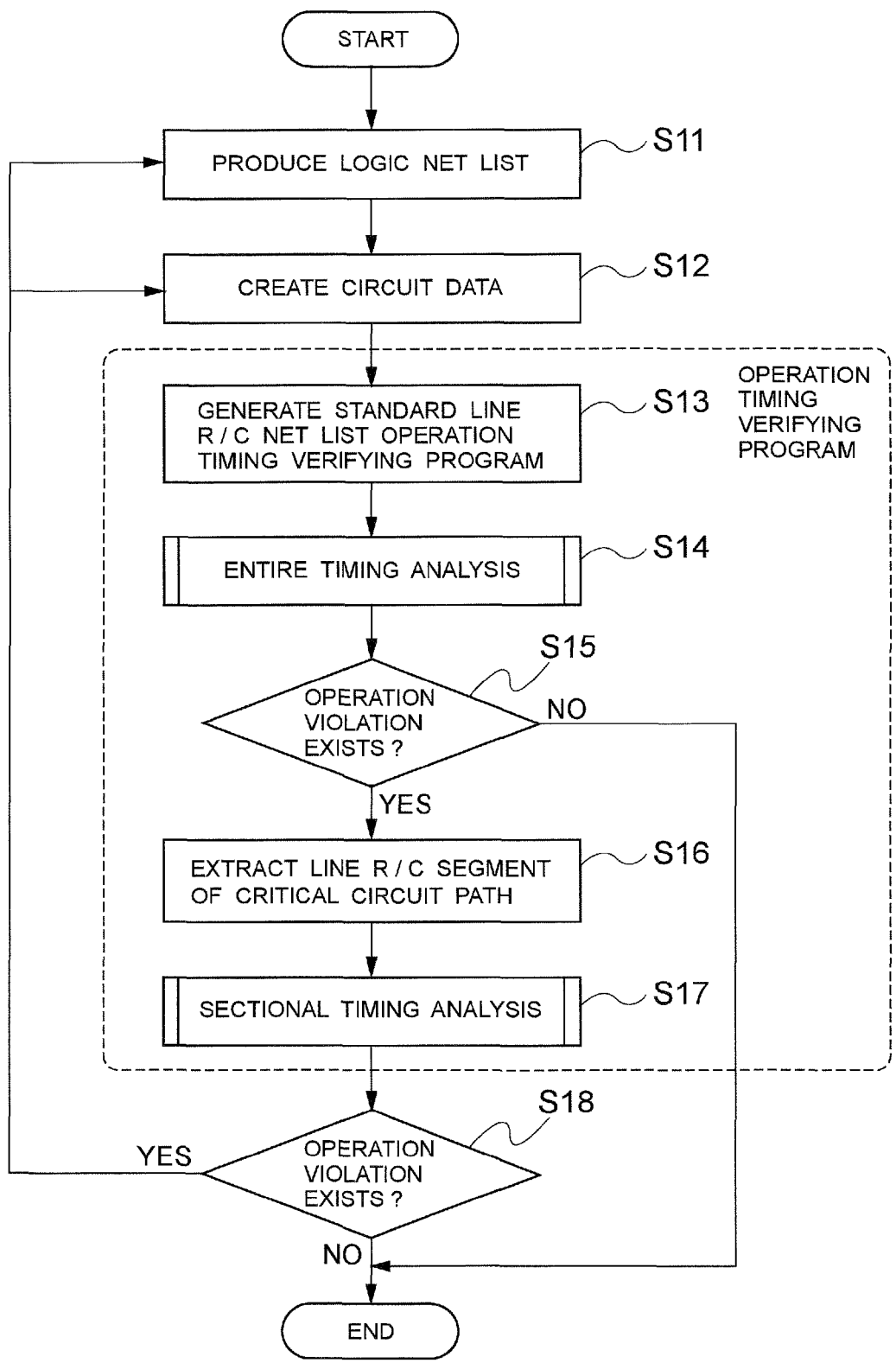
FIG. 7 is a flow chart showing the process procedure of the operation timing verifying program.
Figure 8:
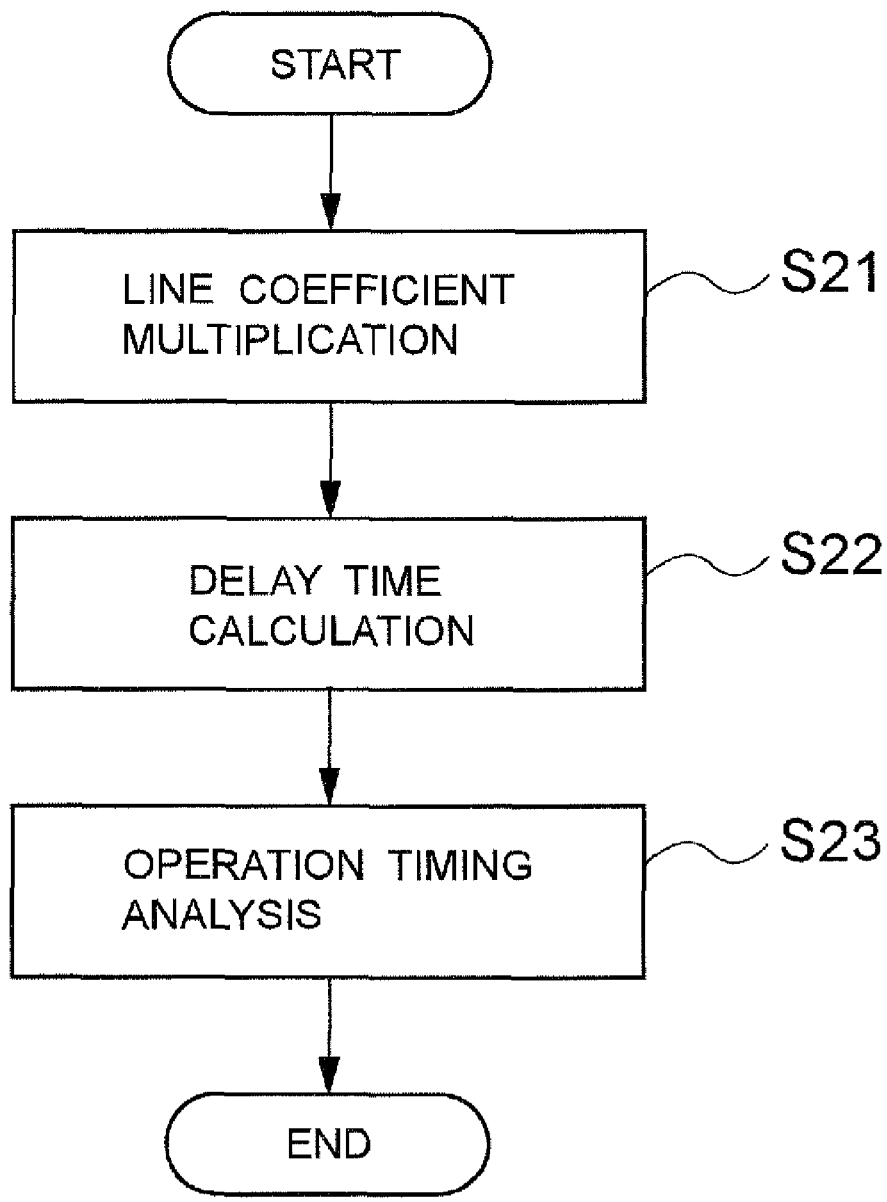
FIG. 8 is a flow chart showing the process procedure of operation timing analysis of the operation timing verifying program.

FIGS. 7, 8 show the process procedure of the operation timing verifying program. The operation timing verifying program is executed by a computer such as a work station in the operating environment shown in FIG. 4. The premise is that a designer has created the logic circuits of a semiconductor integrated circuit (LSI) and a logic net list is produced (step S11). Further, it is assumed that circuit data representing a circuit layout where logic cells are arranged and connection lines are placed between the logic cells has been created based on the logic net list (step S12).

Referring to FIG. 7, first, the operation timing verifying program calculates the line capacitances and line resistances of the connection lines between all the logic cells in the circuit layout and generates a standard line R/C net list containing the calculation results (step S13). The standard line R/C net list is generated based on standard structure values that are free of line processing variation.

Next, using the generated standard line R/C net list as input, the operation timing verifying program performs operation timing analysis on all circuit paths of the circuit layout, that is, entire timing analysis (step S14).

FIG. 8 shows the process procedure of the operation timing analysis. In the entire timing analysis, using the standard line R/C net list and the logic cell delay library as input, operation timings are verified in the two corner conditions from the entire timing analysis corner table (see FIG. 5).

First, the operation timing verifying program multiplies all the line capacitances and line resistances of the standard line R/C net list respectively by line coefficients such as capacitance coefficient (Cj) and resistance coefficient (Rj) of the entire timing analysis corner table (see FIG. 5), thereby generating a converted R/C net list for each of the two corner conditions (CRmaxTmax and CRminTmin) (step S21).

Then, the operation timing verifying program calculates the delay time of each circuit path contained in the circuit layout of the semiconductor integrated circuit for each of the two corner conditions by combining the R/C net lists for the two corner conditions (CRmaxTmax and CRminTmin) respectively with maximum and minimum delay times of the logic cells stored in the logic cell delay library (step S22).

Next, the operation timing verifying program performs operation timing analysis on each circuit path based on the obtained delay times for each of the two corner conditions (CRmaxTmax and CRminTmin) (step S23), thereby extracting the circuit paths where an operation violation occurs, namely, critical circuit paths. Here, information about the critical circuit paths may be output into the operation timing violation report.

Referring again to FIG. 7, the operation timing verifying program determines whether a critical circuit path has been extracted as a result of the entire timing analysis at step S14, and if not, the process ends (step S15).

On the other hand, if a critical circuit path has been extracted, the operation timing verifying program extracts the line R/C segment of that circuit path (step S16) and performs sectional timing analysis on that segment (step S17). The sectional timing analysis is performed by performing the operation timing analysis of FIG. 8, and the same procedure as the entire timing analysis is executed using the corner conditions of the sectional timing analysis corner table (see FIG. 6) for operation timing verification.

The sectional timing analysis will be specifically described with reference to FIG. 8. The operation timing verifying program multiplies the line capacitances and line resistances of the segment of the circuit path extracted from the standard line R/C net list respectively by line coefficients such as capacitance coefficient (Cj) and resistance coefficient (Rj) of the sectional timing analysis corner table (see FIG. 6), thereby generating a converted R/C net list for each of the four corner conditions (CmaxRminTmax, CminRmaxTmax, CmaxRminTmin, and CminRmaxTmin) (step S21).

Then, the operation timing verifying program calculates the delay time of the critical circuit path for each of the four corner conditions by combining the R/C net lists for the four corner conditions with maximum and minimum delay times of logic cells stored in the logic cell delay library (step S22). Next, operation timing analysis is performed on that circuit path based on the obtained delay time for each of the four corner conditions to determine finally whether an operation violation exists (step S23). This sectional timing analysis is performed on each critical circuit path. The analysis results are output as the operation timing violation report.

The designer determines whether an operation timing violation exists based on the operation timing violation report (step S18) and can redesign by correcting the logic circuit or layout of the segment where an operation timing violation exists (steps S11, S12)

As obvious from the above embodiment, the present invention is characterized in that in the operation timing verification of a semiconductor integrated circuit in unreal corner conditions, critical circuit paths, which would violate timing requirements, are extracted, and highly accurate timing analysis in real corner conditions is performed on the critical circuit paths.

Because by applying the present invention to the design of a semiconductor integrated circuit and performing timing analysis in real corner conditions on critical circuit paths, circuit paths in violation can be extracted highly accurately, it is possible to minimize the unreality of timings and reduce design cost. Further, the time required to perform operation timing verification can be greatly reduced as compared with a method which repeats line R/C calculation, delay calculation, and operation timing analysis on all circuit paths of a circuit layout a plurality of times. Yet further, conventionally, because logic circuits and layouts are corrected based on the operation timing violation report obtained through operation timing analysis in unreal conditions, paths which would not be in violation in real corner conditions are also corrected, and thus the cost of the correction is great. By applying the present invention, the cost of circuit correction can be minimized.

In the above embodiment, as shown in FIGS. 7 and 8, first, the standard line R/C net list is generated, and line coefficient multiplication is performed on the contents of the obtained standard line R/C net list, thereby generating R/C net lists for corner conditions, but instead in the sectional timing analysis, standard line R/C for critical line paths may be recalculated, resulting in the same effect.

In the above embodiment, as shown in FIG. 2, the corner conditions in the sectional timing analysis are ones obtained by combining conditions CmaxRmin and CminRmax in the real corner condition range (area A) with minimum and maximum temperatures, but if examining the line process and combinations of variations reveals that the condition at a middle point on the line between the coordinate points CmaxRmin and CminRmax in the area A can cause operation timings to be worse, sectional timing analysis in that condition may be applied.

What is claimed is:

1. An operation timing verifying apparatus which reads in circuit data representing a circuit layout including a plurality of delay elements and performs operation timing analysis in a settable operating condition on said circuit layout, comprising:
   an operation-violating circuit path extracting unit that sets an unreal corner condition that all of said delay elements present a maximum delay as said operating condition and performs said operation timing analysis, thereby extracting an operation-violating circuit path, if any, from said circuit layout; and
   an operation violation determining unit that, if said operation-violating circuit path is extracted, sets a real corner condition that at least one element type of delay elements from among said delay elements present a maximum delay as said operating condition and performs said operation timing analysis on only said operation-violating circuit path to determine again whether an operation violation exists therein.

2. An operation timing verifying apparatus according to claim 1, wherein said operation violation determining unit selects at least one element type from among line resistance, line capacitance, and logic cell that are element types and sets an unreal corner condition that said at least one element type of delay elements present a maximum delay.

3. An operation timing verifying apparatus according to claim 2, wherein said operation violation determining unit performs said operation timing analysis for each combination of said element types.

4. An operation timing verifying apparatus according to claim 2, wherein said operation-violating circuit path extracting unit performs said operation timing analysis in an unreal corner condition that all of said delay elements present a minimum delay as well, and said operation violation determining unit sets a real corner condition that at least one element type of delay elements from among said delay elements present a minimum delay as said operating condition and performs said operation timing analysis in that real corner condition as well.

5. An operation timing verifying apparatus according to claim 1, wherein said operation violation determining unit performs said operation timing analysis for each combination of said element types.

6. An operation timing verifying apparatus according to claim 1, wherein said operation-violating circuit path extracting unit performs said operation timing analysis in an unreal corner condition that all of said delay elements present a minimum delay as well, and said operation violation determining unit sets a real corner condition that at least one element type of delay elements from among said delay elements present a minimum delay as said operating condition and performs said operation timing analysis in that real corner condition as well.

7. An operation timing verifying method for making a computer to function as means to read in circuit data representing a circuit layout including a plurality of delay elements and to perform an operation timing analysis in a settable operating condition on said circuit layout, said operation timing verifying method comprising:
   extracting an operation-violating circuit path using the computer, if any, from said circuit layout by setting an unreal corner condition that all of said delay elements present a maximum delay as said operating condition and performing said operation timing analysis; and
   determining an operation violation using the computer, if said operation-violating circuit path is extracted, by setting a real corner condition that at least one element type of delay elements from among said delay elements present a maximum delay as said operating condition and performing said operation timing analysis on only said operation-violating circuit path to determine again whether an operation violation exists therein.

8. A system for verifying an operation timing comprising a computer and an operation verifying program for making the computer to function as means to read in circuit data representing a circuit layout including a plurality of delay elements and to perform an operation timing analysis in a settable operating condition on said circuit layout, said operation timing verifying program comprising codes for:
   extracting an operation-violating circuit path, if any, from said circuit layout by setting an unreal corner condition that all of said delay elements present a maximum delay as said operating condition and performing said operation timing analysis; and
   determining an operation violation, if said operation-violating circuit path is extracted, by setting a real corner condition that at least one element type of delay elements from among said delay elements present a maximum delay as said operating condition and performing said operation timing analysis on only said operation-violating circuit path to determine again whether an operation violation exists therein.

9. A non-transitory computer readable medium, embedded thereon an operation timing verifying program, which when executed by a computer, causes the computer to function as means to read in circuit data representing a circuit layout including a plurality of delay elements and to perform an operation timing analysis in a settable operating condition on said circuit layout, said operation timing verifying program comprising codes for:
   extracting an operation-violating circuit path, if any, from said circuit layout by setting an unreal corner condition that all of said delay elements present a maximum delay as said operating condition and performing said operation timing analysis; and determining an operation violation, if said operation-violating circuit path is extracted, by setting a real corner condition that at least one element type of delay elements from among said delay elements present a maximum delay as said operating condition and performing said operation timing analysis on only said operation-violating circuit path to determine again whether an operation violation exists therein.

* * * * *